United States Patent
Matsubara (10) Patent No.: US 11,823,872 B2
(45) Date of Patent: Nov. 21, 2023

(54) ELECTROSTATIC CHUCK APPARATUS AND SEMICONDUCTOR MANUFACTURING APPARATUS

(71) Applicant: Kioxia Corporation, Tokyo (JP)

(72) Inventor: Yuya Matsubara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 293 days.

(21) Appl. No.: 17/463,834

(22) Filed: Sep. 1, 2021

(65) Prior Publication Data

US 2022/0108877 A1    Apr. 7, 2022

(30) Foreign Application Priority Data

Oct. 5, 2020 (JP) .................................. 2020-168595

(51) Int. Cl.
H01J 37/32 (2006.01)
H01L 21/683 (2006.01)
C23C 16/458 (2006.01)

(52) U.S. Cl.
CPC .... H01J 37/32715 (2013.01); C23C 16/4586 (2013.01); H01L 21/6833 (2013.01); H01J 2237/2007 (2013.01); H01J 2237/332 (2013.01)

(58) Field of Classification Search
CPC ......... H01J 37/32715; H01J 2237/2007; H01J 2237/332–3348; H01L 21/6833; C23C 16/4586
USPC .......... 118/728, 715–733; 156/345.1–345.55
See application file for complete search history.

(56) References Cited

U.S. PATENT DOCUMENTS

| | | | | |
|---|---|---|---|---|
| 5,656,093 | A * | 8/1997 | Burkhart | H01L 21/6831 118/503 |
| 5,745,332 | A * | 4/1998 | Burkhart | H01L 21/6833 361/234 |
| 5,841,624 | A * | 11/1998 | Xu | H02N 13/00 279/128 |
| 5,886,863 | A * | 3/1999 | Nagasaki | H02N 13/00 279/128 |
| 6,373,681 | B2 * | 4/2002 | Kanno | H01L 21/6833 361/234 |
| 7,161,662 | B2 * | 1/2007 | Ottens | G03F 7/70783 355/75 |
| 7,623,334 | B2 * | 11/2009 | Mizuno | H01L 21/6875 361/230 |
| 8,879,233 | B2 * | 11/2014 | Cooke | H01L 21/6875 361/234 |

(Continued)

FOREIGN PATENT DOCUMENTS

JP    09-327188 A    12/1997
JP    2013-197465 A    9/2013

(Continued)

*Primary Examiner* — Charlee J. C. Bennett
(74) *Attorney, Agent, or Firm* — Foley & Lardner LLP (57) ABSTRACT

According to one embodiment, an electrostatic chuck apparatus includes a substrate support plate formed of a dielectric material. The substrate support plate includes: a plurality of support bases protruding from an upper surface of the substrate support plate, a plurality of ground electrodes formed inside the substrate support plate, each of the ground electrodes at a corresponding position to a respective one the support bases, and an electrostatic chuck electrode provided below the ground electrodes.

18 Claims, 5 Drawing Sheets

(56) References Cited

U.S. PATENT DOCUMENTS

| | | | |
|---|---|---|---|
| 11,309,207 B2* | 4/2022 | Donnell | H01L 21/68785 |
| 2002/0043527 A1* | 4/2002 | Ito | H01L 21/67103 |
| | | | 219/385 |
| 2003/0104186 A1* | 6/2003 | Ito | H01L 23/49827 |
| | | | 428/209 |
| 2018/0144945 A1 | 5/2018 | Takahashi et al. | |
| 2019/0148205 A1* | 5/2019 | Kim | H01J 37/3244 |
| | | | 156/345.33 |
| 2021/0242062 A1* | 8/2021 | Jung | C23C 16/4586 |

FOREIGN PATENT DOCUMENTS

| | | |
|---|---|---|
| JP | 2016-051783 A | 4/2016 |
| JP | 2018-085372 A | 5/2018 |

* cited by examiner

FIG. 5

ELECTROSTATIC CHUCK APPARATUS AND SEMICONDUCTOR MANUFACTURING APPARATUS

CROSS-REFERENCE TO RELATED APPLICATION

This application is based upon and claims the benefit of priority from Japanese Patent Application No. 2020-168595, filed Oct. 5, 2020, the entire contents of which are incorporated herein by reference.

FIELD

Embodiments described herein relate generally to an electrostatic chuck apparatus and a semiconductor manufacturing apparatus.

BACKGROUND

An electrostatic chuck apparatus having a substrate support plate for supporting and retaining a semiconductor substrate is provided in a semiconductor manufacturing apparatus such as an etching apparatus or a film forming apparatus.

The temperature of the substrate support plate is adjusted in a temperature ranging from low temperature to high temperature so that the semiconductor substrate heated by a process such as etching or film formation reaches a predetermined temperature.

When film formation is performed under high temperature conditions, by chucking the wafer on the substrate support plate by electrostatic force, the warpage of the wafer caused by Coulomb force can be prevented.

DETAILED DESCRIPTION

By the way, it is known that a substrate support plate is provided with a protrusion-shaped support base on the upper surface of the substrate support plate in order to reduce a contact area with respect to a wafer which is a support target.

When the wafer is electrostatically chucked in such the substrate support plate, a Johnsen-Rahbek force acts between the support base and the wafer, and there is a concern that a suction force becomes excessive, which may cause scratches on the wafer.

Embodiments provide an electrostatic chuck apparatus and a semiconductor manufacturing apparatus capable of preventing scratches from occurring on a wafer without a Johnsen-Rahbek force generated between a support base and the wafer even when a voltage is applied for electrostatic chuck.

In general, according to one embodiment, an electrostatic chuck apparatus includes a substrate support plate formed of a dielectric material. The substrate support plate includes: a plurality of support bases protruding from an upper surface of the substrate support plate, a plurality of ground electrodes formed inside the substrate support plate, each of the ground electrodes at a corresponding position to a respective one the support bases, and an electrostatic chuck electrode provided below the ground electrodes.

Hereinafter, embodiments that are not limitative but illustrative will be described with reference to the attached drawings. In all the attached drawings, the same or corresponding members or parts are denoted by the same or corresponding reference numerals, and redundant description thereof is omitted. In addition, the drawings are not intended to illustrate the relative ratio of dimensions between members or parts, and thus, specific dimensions may be determined by a person skilled in the art in light of the following non-limitative embodiments.

Figure 1:
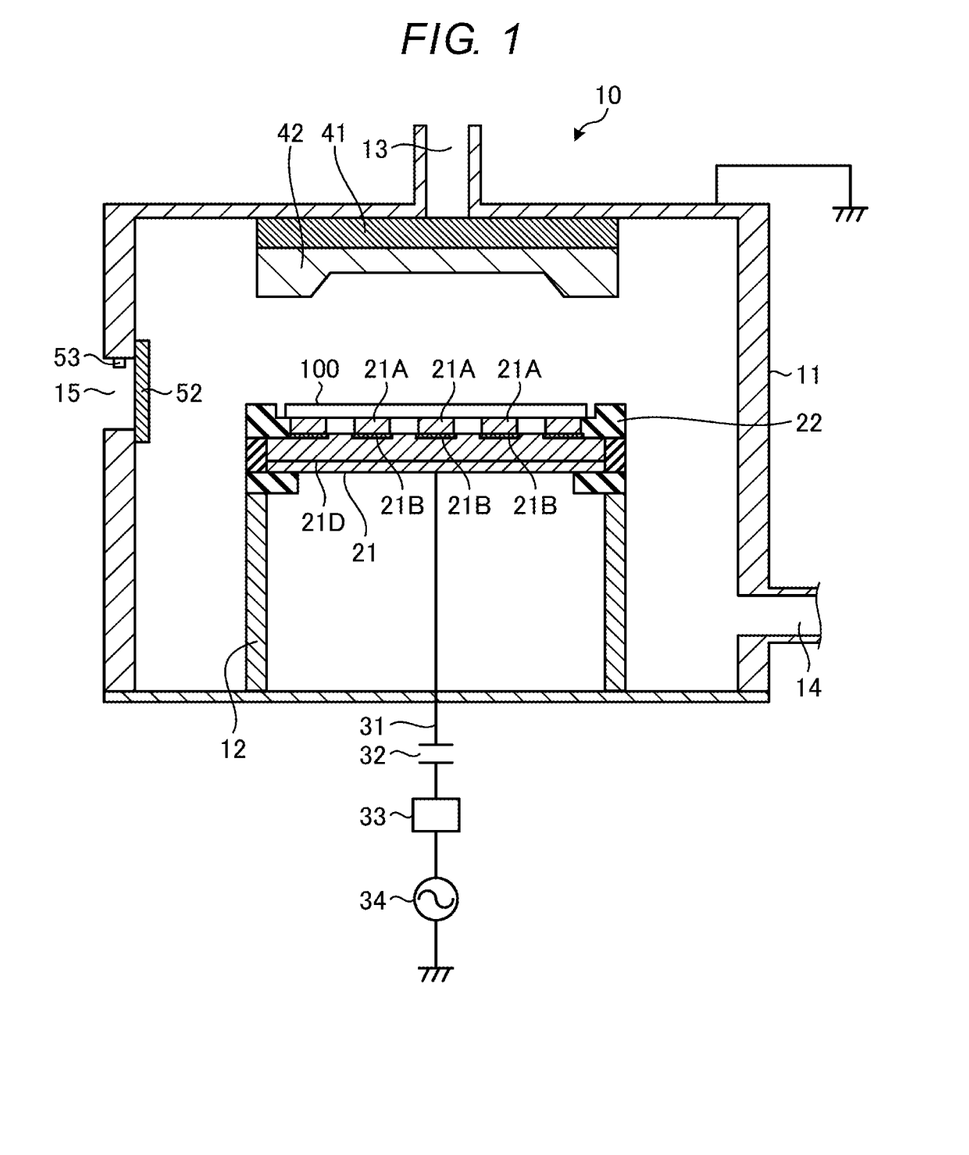
FIG. 1 is a schematic configuration diagram of a plasma processing apparatus as an example of a semiconductor manufacturing apparatus according to an embodiment.

FIG. 1 is a schematic configuration diagram of a plasma processing apparatus as an example of a semiconductor manufacturing apparatus according to an embodiment.

As illustrated in FIG. 1, a plasma processing apparatus 10 includes a chamber 11, and a gas supply port 13 for supplying a processing gas used for plasma processing and a gas exhaust port 14 for exhausting the processing gas are provided in the chamber 11.

The gas supply port 13 is connected to a processing gas supply source (not illustrated) by a predetermined pipe, and an exhaust device (not illustrated) such as a vacuum pump is connected to the gas exhaust port 14.

In addition, the chamber 11 is made of a metal such as aluminum or an alloy such as stainless steel. The chamber 11 is grounded.

A substrate support plate 21 is provided inside the chamber 11. The substrate support plate 21 has an electrostatic chuck, and thus, a substrate 100 such as a wafer which is a plasma-processing target can be retained on the upper surface of the substrate support plate 21. An outer ring 22 is provided on the periphery of the substrate support plate 21. The outer ring 22 control electric field around the substrate.

The substrate support plate 21 is fixed by a support unit 12 so as to be located in the central vicinity in the chamber 11.

In addition, a feeder line 31 for supplying high-frequency power is connected to the substrate support plate 21, and a blocking capacitor 32, a matching unit 33, and a high-frequency power supply 34 are connected to the feeder line 31. High-frequency power having a predetermined frequency is supplied to the substrate support plate 21 from the high-frequency power supply 34. That is, the substrate support plate 21 also functions as a lower electrode.

In addition, a conduit (not illustrated) is formed inside the substrate support plate 21. A temperature-controlled fluid is supplied to the conduit from an external temperature controller, and thus, the temperature of the substrate support plate 21 and the substrate 100 which is a processing target mounted on the upper surface of the substrate support plate 21 is adjusted.

An upper electrode 42 is provided above the substrate support plate 21 so as to face the substrate support plate 21. The upper electrode 42 is fixed to a member 41 provided on a top plate inside the chamber 11 with being separated by a predetermined distance from the substrate support plate 21 so as to face the substrate support plate 21 in parallel. With such a structure, the upper electrode 42 and the substrate support plate 21 configure a pair of parallel plate electrodes. The upper electrode 42 has, for example, a disk shape. The upper electrode 42 is, for example, an electrode made of silicon. It is noted that the upper electrode 42 and the member 41 are provided with a plurality of gas supply paths (not illustrated) penetrating the upper electrode and the member in the thickness direction. Accordingly, the processing gases are introduced into the chamber 11 from the gas supply port 13 through the gas supply paths.

For example, an opening 15 for taking in and out the substrate 100 is formed in a side wall of the chamber 11, and a shutter 52 is provided in the opening 15. The shutter 52 has a role of partitioning the outside and the inside of the chamber 11, and is opened so as to connect the opening 15 and the inside of the chamber 11 when taking in and out the substrate 100. A sensor 53 that detects the position with respect to a transfer arm (not illustrated) which transfers the substrate 100 in the chamber 11 is provided in the opening 15. The sensor 53 is configured as, for example, a distance sensor.

Figure 2:
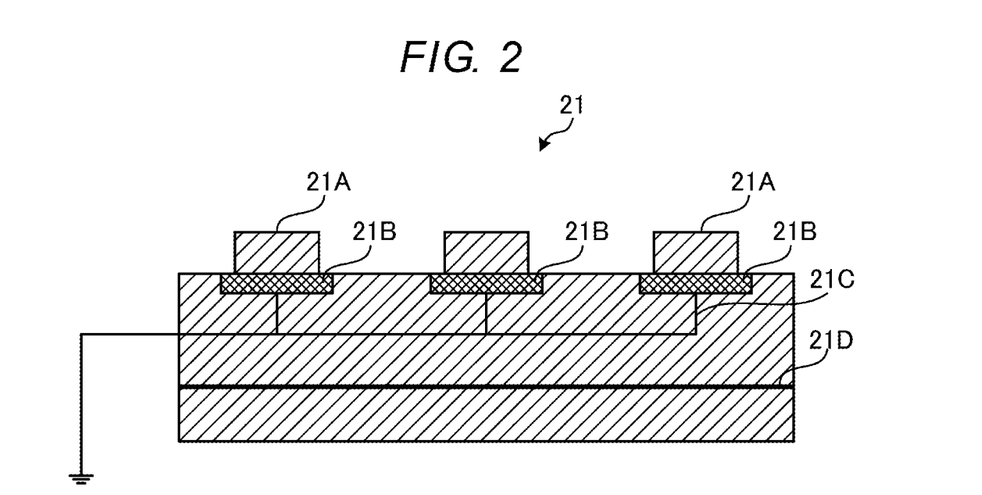
FIG. 2 is a schematic cross-sectional view of a substrate support plate.

FIG. 2 is a schematic cross-sectional view of the substrate support plate 21.

A plurality of support bases (protrusion portions) 21A, each of which is made of the same dielectric material as that of the substrate support plate 21, has a cylindrical shape in appearance, and is supported so that the substrate which is the processing target is in contact with the upper surface thereof, are formed on the upper surface of the substrate support plate 21.

For example, an inert gas (for example, helium gas) is supplied to a space formed by the support bases 21A between the back surface of the substrate 100 and the non-formation portion of the support base 21A of the substrate support plate 21. Therefore, it is possible to allow the temperature of the substrate 100 mounted on the substrate support plate 21 to be uniform.

Figure 3:
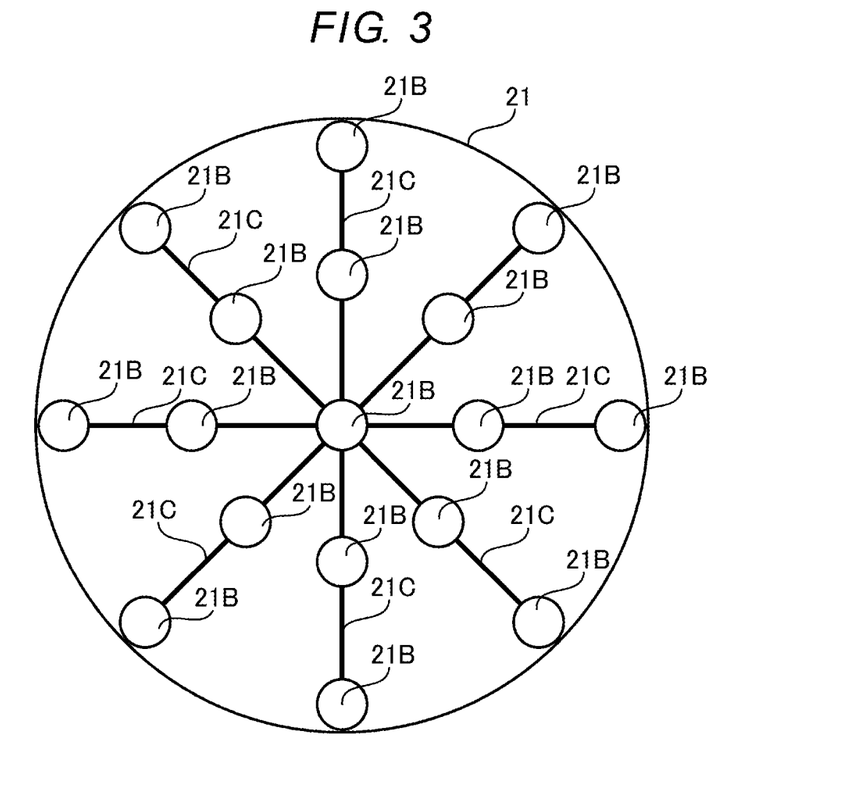
FIG. 3 is a plan view illustrating an arrangement of ground electrodes.

FIG. 3 is a plan view illustrating an arrangement of the ground electrodes.

A plurality of ground electrodes 21B (seventeen ground electrodes 21B in the example of FIG. 3) having a diameter larger than a diameter of the support base 21A are disposed at positions corresponding to the respective support bases 21A inside the substrate support plate 21.

In addition, as illustrated in FIG. 3, the ground electrodes 21B are connected to each other by ground wirings 21C inside the substrate support plate 21.

In this case, the ground wirings 21C are electrically connected to a ground line at any positions.

The ground electrode 21B and, thus, the support bases 21A are arranged in a radial shape or along a concentric circle. For example, in FIG. 3, the ground electrodes 21B are arranged in a radial shape inside the substrate support plate 21. Therefore, the seventeen support bases 21A are arranged in a radial shape on the upper surface of the substrate support plate 21 at positions corresponding to the ground electrodes 21B.

Specifically, as illustrated in FIG. 3, one ground electrode 21B is disposed at the center of the substrate support plate 21, and the two ground electrodes 21B are arranged centrally symmetrically with the center of the substrate support plate 21 along each of the ground wirings 21C extending through the center of the substrate support plate 21 at an angular interval of 45°.

Therefore, also on the upper surface of the substrate support plate 21, one support base 21A is disposed at the center of the substrate support plate 21, and the two support bases 21A are arranged centrally symmetrically with the center of the substrate support plate 21 at an angle interval of 45°.

The above description is for the case where the support base 21A has a circular shape in a plan view. The support base 21A may only have to have such a size that the orthogonal projection of the support base 21A on the same plane perpendicular to the paper surface in FIG. 2 is included in the orthogonal projection of the ground electrode 21B on the same plane.

Returning to FIG. 2 again, an electrostatic chuck electrode 21D is formed in a disk shape below the ground electrode 21B.

Next, operations of the embodiment will be described with reference to FIGS. 4A and 4B.

Figure 4A:
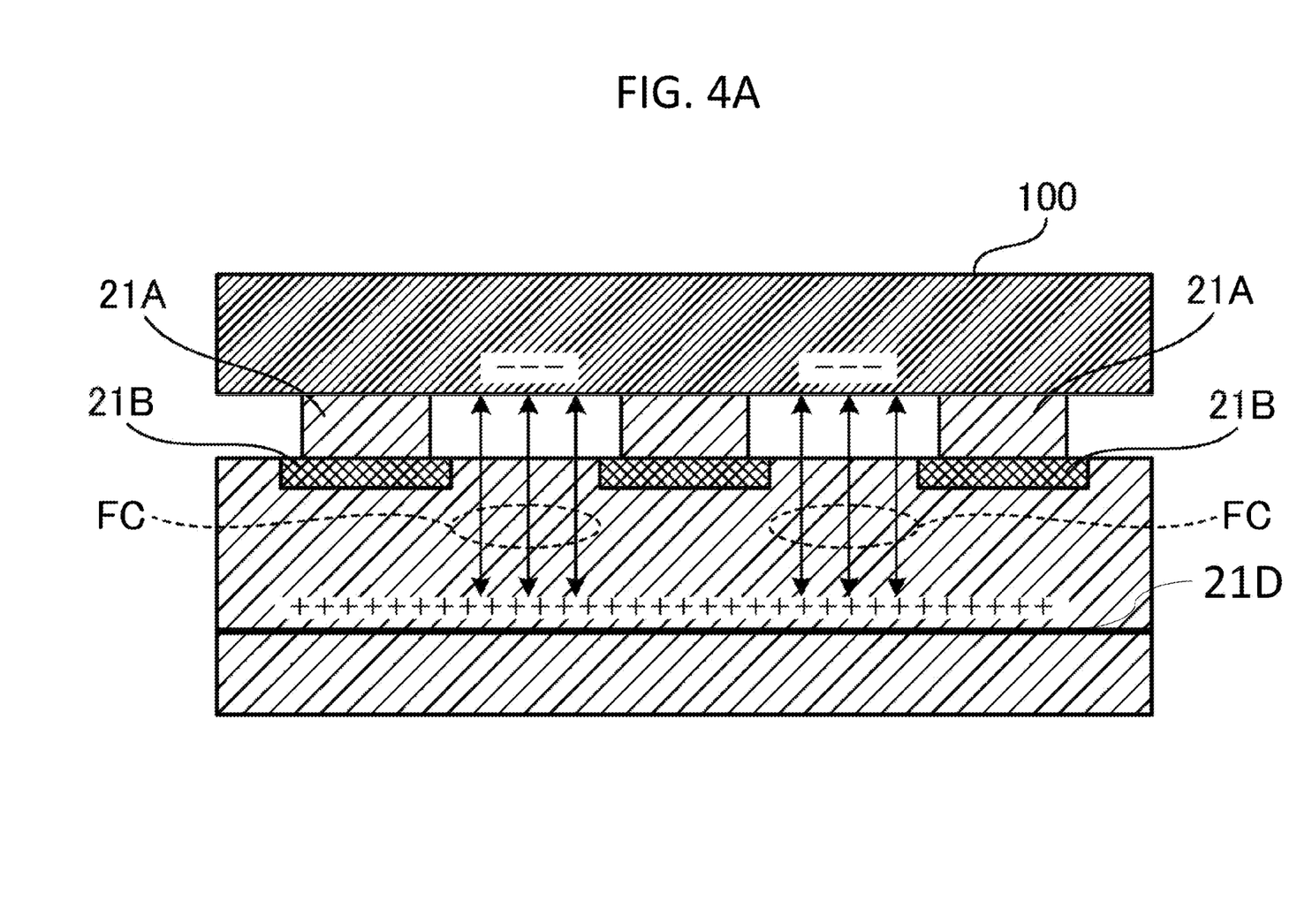
FIG. 4A is a view illustrating operations of the embodiment.

FIG. 4A is a view illustrating the operations of the embodiment.

Figure 4B:
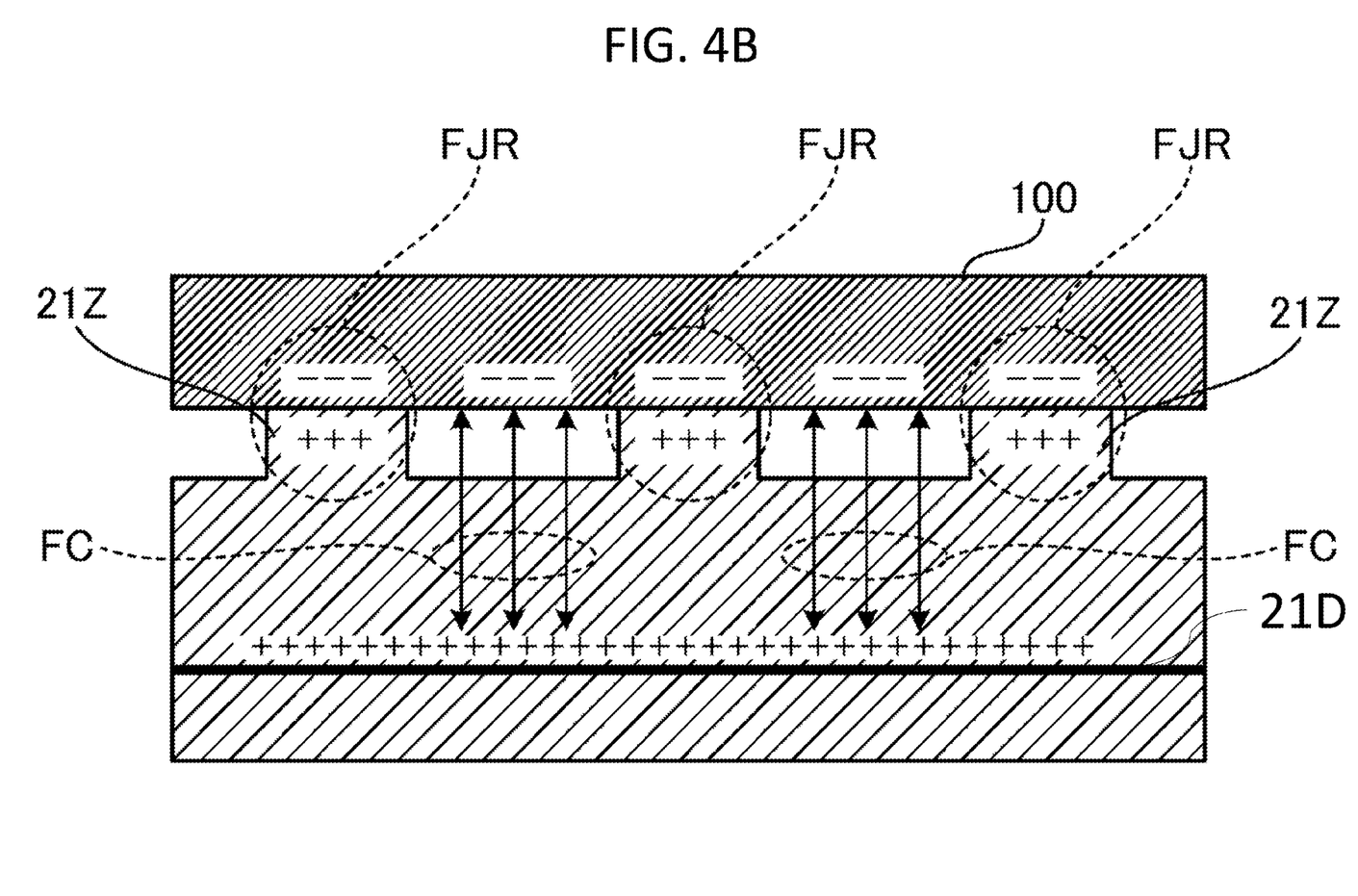
FIG. 4B is a view illustrating operations of a comparative example.

FIG. 4B is a view illustrating operations of a comparative example.

First, problems of the comparative example will be described with reference to FIG. 4B.

As illustrated in FIG. 4B, only a support base 21Z is formed on the substrate support plate of the comparative example.

In this state, when a voltage for chucking is applied through an electrostatic chuck electrode 21D, polarization occurs in the substrate 100 and the support base 21Z in contact with the substrate 100, and a Johnsen-Rahbek force FJR acts.

In this case, the Johnsen-Rahbek force does not contribute to the Coulomb force FC for preventing the warpage of the substrate 100 and reliably performing chucking and causes scratches on the surface of the substrate 100, and for example, in a subsequent thermal process of forming a poly-silicon film or an amorphous silicon film, eaves-like defects are generated on the back surface (lower surface) of the substrate 100, which is a factor of defocus.

On the other hand, as illustrated in FIG. 4A, in the case of the embodiment in which the support base 21A is formed on the surface of the substrate support plate 21 and the ground electrode 21B is formed inside the substrate support plate 21 at a position corresponding to the support base 21A, when a voltage for chucking is applied through the electrostatic chuck electrode 21D, a current flows between the ground electrode 21B and the electrostatic chuck electrode 21D in the formation portion of the ground electrode 21B.

For this reason, no voltage is applied to the formation portion of the support base 21A.

Therefore, polarization does not occur in the substrate 100 and the support base 21A in contact with the substrate 100, and the Johnsen-Rahbek force does not act.

On the other hand, a voltage is applied to the non-formation portion of the support base 21A, and polarization occurs in the substrate 100 and the substrate support plate 21, so that an effective force is applied for chucking in a state in which the substrate 100 is warped by the generated Coulomb force FC.

As described above, according to the present embodiment, since no local stress is applied without the Johnsen-Rahbek force generated between the support base 21A and the substrate 100, it is possible to prevent the scratches from occurring on the back surface of the substrate 100.

Figure 5:
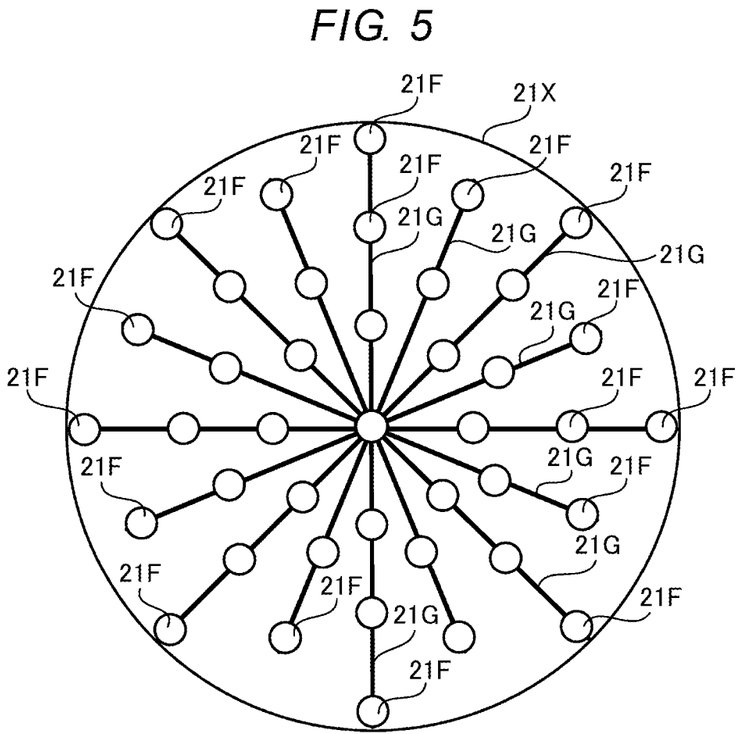
FIG. 5 is a plan view illustrating another arrangement of ground electrodes.

FIG. 5 is a plan view illustrating another arrangement of the ground electrodes.

In FIG. 3, a case where the seventeen ground electrodes 21B are arranged in a radial shape or along a concentric circle is described, but the present example is an example when forty-one ground electrodes 21F are arranged.

That is, as illustrated in FIG. 5, one ground electrode 21F is disposed at the center of a substrate support plate 21X. In addition, a plurality of the ground electrodes 21F are arranged along each of eight ground wirings 21G extending through the center of the substrate support plate 21X at an angular interval of 22.5°.

Specifically, the ground wiring 21G in which the four ground electrodes 21F are arranged centrally symmetrically with the center of the substrate support plate 21X and the ground wiring 21G in which the six ground electrodes 21F are arranged centrally symmetrically with the center of the substrate support plate 21X are alternately arranged at an angular interval of 22.5°.

According to the present example, the diameter (size when viewed in a plan view) of the support base 21A can be reduced as compared with the case illustrated in FIG. 3. For this reason, a large gap between the substrate 100 and the substrate support plate 21X can be allocated, heat conduction can be allowed to be uniform, and temperature uniformity can be improved.

In addition, also in the present example, since no local stress is applied without the Johnsen-Rahbek force generated between the support base 21A and the substrate 100, it is possible to prevent scratches from occurring on the back surface of the substrate 100.

The novel embodiments described herein may be embodied in a variety of other forms. For example, in the above description, the ground electrodes 21B and the ground electrodes 21F are always in a grounded state. Switching mechanisms (for example, switches) may be provided between the ground electrode 21B and the ground and between the ground electrode 21F and the ground so as to be able to switch the ground electrodes 21B or the ground electrodes 21F in the grounded state and a floating state.

Accordingly, when a larger chucking force is required, it is possible to allow the ground electrodes to be in the floating state.

In addition, in the above-described embodiment, the shape of the support base 21A is cylindrical, but any shape such as a polygonal pillar shape is possible as long as the shape can prevent stress from being concentrated on the substrate 100.

In addition, in the above description, the plasma processing apparatus 10 is illustrated as a semiconductor manufacturing apparatus, but the plasma processing apparatus 10 is, for example, a plasma chemical vapor deposition (CVD) apparatus, a sputtering apparatus, an ashing apparatus, or the like using plasma.

In addition, the substrate support plate according to the embodiment is not limited to the plasma processing apparatus and may be applied to a single-wafer thermal CVD apparatus, an annealing apparatus, and a thermal oxidation apparatus.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An electrostatic chuck apparatus comprising:
   a substrate support plate formed of a dielectric material, the substrate support plate including:
      a plurality of support bases protruding from an upper surface of the substrate support plate,
      a plurality of ground electrodes formed inside the substrate support plate, each of the ground electrodes at a corresponding position to a respective one the support bases, and
      an electrostatic chuck electrode provided below the ground electrodes.

2. The electrostatic chuck apparatus according to claim 1, wherein the support base has a shape such that an orthogonal projection of the support base is included within an orthogonal projection of the corresponding ground electrode.

3. The electrostatic chuck apparatus according to claim 1, wherein the ground electrodes are electrically insulated from the electrostatic chuck electrode.

4. The electrostatic chuck apparatus according to claim 1, wherein the substrate support plate has a disk shape, and
   wherein the support bases and the corresponding ground electrodes are arranged at positions that are rotationally symmetric with respect to a center of the substrate support plate.

5. The electrostatic chuck apparatus according to claim 1, further comprising a switch configured to switch a state of the ground electrode between a grounding state and a floating state.

6. A semiconductor manufacturing apparatus comprising:
   a chamber; and
   a substrate support plate formed of a dielectric material, disposed in the chamber, and including:
      a plurality of support bases protruding formed an upper surface of the substrate support plate,
      a plurality of ground electrodes formed inside the substrate support plate, each of the ground electrodes at a corresponding position to a respective one the support bases, and
      an electrostatic chuck electrode provided below the ground electrode.

7. The electrostatic chuck apparatus according to claim 1, wherein the support base has a cylindrical shape.

8. The electrostatic chuck apparatus according to claim 1, wherein one of the plurality of support bases is formed at a center of the support base and the remaining ones of the plurality of support bases are arranged at one of plural radial positions relative to the center.

9. The electrostatic chuck apparatus according to claim 1, wherein each of the plurality of support bases and the corresponding one of the plurality of ground electrodes are in contact with each other.

10. The electrostatic chuck apparatus according to claim 1, wherein the plurality of support bases are configured to be in direct contact with a substrate.

11. The electrostatic chuck apparatus according to claim 10, wherein the electrostatic chuck electrode is configured to be applied with a voltage and the plurality of support bases are in a ground state.

12. The electrostatic chuck apparatus according to claim 10, wherein a space between a bottom surface of the substrate and the upper surface of the substrate support plate is filled with an inert gas.

13. The semiconductor manufacturing apparatus according to claim 6, wherein each of the support bases has a cylindrical shape.

14. The semiconductor manufacturing apparatus according to claim 6, wherein one of the plurality of support bases is formed at a center of the support base and the remaining ones of the plurality of support bases are arranged at one of plural radial positions relative to the center.

15. The semiconductor manufacturing apparatus according to claim 6, wherein the support base and the corresponding ground electrode are in contact with each other.

16. The semiconductor manufacturing apparatus according to claim 6, wherein the plurality of support bases are configured to be in direct contact with a substrate.

17. The semiconductor manufacturing apparatus according to claim 16, wherein the electrostatic chuck electrode is configured to be applied with a voltage and the plurality of support bases are in a ground state.

18. The semiconductor manufacturing apparatus according to claim 16, wherein a space between a bottom surface of the substrate and the upper surface of the substrate support plate is filled with an inert gas.

\* \* \* \* \*